US006468586B1

(12) United States Patent
Gurer et al.

(10) Patent No.: US 6,468,586 B1
(45) Date of Patent: *Oct. 22, 2002

(54) ENVIRONMENT EXCHANGE CONTROL FOR MATERIAL ON A WAFER SURFACE

(75) Inventors: Emir Gurer, Scotts Valley, CA (US); Ed C. Lee, Cupertino, CA (US); Tom Zhong, Santa Clara, CA (US); Kevin Golden, Wallkill, NY (US); John W. Lewellen, San Jose, CA (US); Scott C. Wackerman, Mountain View, CA (US); Reese Reynolds, Los Gatos, CA (US)

(73) Assignee: Silicon Valley Group, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/566,605

(22) Filed: May 8, 2000

Related U.S. Application Data

(63) Continuation-in-part of application No. 09/222,117, filed on Dec. 29, 1998, now Pat. No. 6,254,936.
(60) Provisional application No. 60/100,219, filed on Sep. 14, 1998.

(51) Int. Cl.[7] .................................................. B05D 3/04
(52) U.S. Cl. ..................... 427/240; 427/314; 427/377; 427/421; 427/425; 118/52; 118/320
(58) Field of Search ................................ 427/240, 314, 427/316, 318, 319, 421, 427, 376.1, 376.3, 376.4, 377, 425; 118/52, 320

(56) References Cited

U.S. PATENT DOCUMENTS

| | | | |
|---|---|---|---|
| 5,358,740 A | 10/1994 | Bornside et al. | 427/240 |
| 5,658,387 A | 8/1997 | Reardon et al. | 118/323 |

(List continued on next page.)

FOREIGN PATENT DOCUMENTS

| | | | |
|---|---|---|---|
| EP | 0 747 767 A2 | 11/1996 | G03F/7/004 |
| EP | 0 854 390 A1 | 7/1998 | G03F/7/38 |

OTHER PUBLICATIONS

Patent Abstracts of Japan, vol. 1998, No. 13, Nov. 30, 1998 (JP 10–214775, Aug. 11, 1988, Hideyuki).
Patent Abstracts of Japan, vol. 013, No. 138, Apr. 6, 1989, (JP 63–304250, Dec. 12, 1988, Mitsuro).
Patent Abstracts of Japan, vol. 014, No. 148, Mar. 20, 1990, (Jp 02–008853, Jan. 12, 1990, Kazushi).
Patent Abstracts of Japan, vol. 1995, No. 09, Oct. 31, 1995, (JP 07–161619, Jun. 23, 1995, Keizo).
Patent Abstracts of Japan, vol. 008, No. 183, Aug 23, 1984, (JP 59–074552, Apr. 27, 1984, Toshio).
Patent Abstracts of Japan, vol. 1998, No. 12, Oct. 31, 1998, (JP 10–198048, Jul. 31, 1998, Isao).

*Primary Examiner*—Shrive P. Beck
*Assistant Examiner*—Kirsten A. Crockford
(74) *Attorney, Agent, or Firm*—V. P. Peter Eng.; Wilson Sonsini Goodrich & Rosati

(57) ABSTRACT

Systems and methods are described for environmental exchange control for a polymer on a wafer surface. An apparatus for controlling an exchange between an environment and a polymer on a surface of a wafer located in the environment includes: a chamber adapted to hold the wafer, define the environment, and maintain the polymer in an adjacent relationship with the environment; and a heater coupled to the chamber. A method for improving performance of a spin-on material includes: forming the spin-on material on a surface of a wafer; then locating the spin-on material in an environment so that said environment is adjacent said spin-on material; and then controlling an exchange between the spin-on material and said environment. The systems and methods provide advantages because inappropriate deprotection is mitigated by careful control of the environmental temperature and environmental species partial pressures (e.g. relative humidity).

12 Claims, 2 Drawing Sheets

U.S. PATENT DOCUMENTS

| | | |
|---|---|---|
| 5,670,210 A | 9/1997 | Mandal et al. ............... 427/240 |
| 5,766,671 A | 6/1998 | Matsui ........................... 427/8 |
| 5,792,590 A | 8/1998 | Hirasawa .................... 430/296 |
| 5,824,604 A | 10/1998 | Bar-Gassa .................. 438/725 |
| 5,885,755 A | 3/1999 | Nakagawa et al. ......... 430/325 |
| 5,954,878 A | 9/1999 | Mandal et al. ............... 118/319 |
| 5,968,691 A | 10/1999 | Yoshioka et al. .............. 430/30 |
| 6,002,108 A | 12/1999 | Yoshioka .................... 219/377 |
| 6,027,760 A | 2/2000 | Gurer et al. .................... 427/8 |
| 6,042,994 A | 3/2000 | Yang et al. ................. 430/296 |
| 6,254,936 B1 * | 7/2001 | Gurer et al. ................. 427/377 |

* cited by examiner

ENVIRONMENT EXCHANGE CONTROL FOR MATERIAL ON A WAFER SURFACE

CROSS-REFERENCE TO RELATED APPLICATIONS

This application is a continuation-in-part of U.S. Ser. No. 09/222,117, filed Dec. 29, 1998, now U.S. Pat. No. 6,254, 936, which is a continuation-in-part of U.S. Ser. No. 60/100, 219, filed Sep. 14, 1998, now pending, the entire contents of which are hereby incorporated herein by reference as if fully set forth herein.

BACKGROUND OF THE INVENTION

1. Field of the Invention

The invention relates generally to the field of microelectronic fabrication. More particularly, the invention relates to the fabrication of polymeric microelectronic structures, such as photoresist masks and low dielectric constant materials.

2. Discussion of the Related Art

The manufacturing of advanced semiconductors requires the production of circuit features at the sub micron level. A very sensitive photoresist is needed to define these features. The problems encountered in obtaining the maximum performance out of these sensitive photoresists is known to those skilled in the art of photolithography.

A class of new generation deep ultra-violet (DUV) chemically amplified photoresists based on "ACETAL" chemistry is required to produce features between 0.10–0.25 um using an exposure wavelength of 248 nm. One problem with ACETAL-based photoresists is that they are very sensitive to the chemical environment throughout the lithography process sequence. This is due to the fact that the chemical "deprotection" reaction that takes place during the post exposure bake (PEB) process requires the presence of moisture along with a photacid created during the previous exposure step. If the previous post application bake (PAB) process conditions and the stepper environment are not carefully optimized, and film moisture content decreases below a certain value, the ultimate lithographic performance of these photoresists will deteriorate significantly. Since deprotection has to occur at a precise time in the process sequence the moisture content at any given time of the process sequence is critical. What is needed is a solution to this moisture sensitivity.

The second problem with the ACETAL-based chemistries is that deblocking reaction rate of an ACETAL-based resist is much faster than the less sensitive DUV chemistries such as T-BOC resists due to a weak H—O physical bond. This is why the deblocking reaction starts at room temperature, thus causing contamination of the projection optics of the exposure tools (step and scanner) during the exposure step. What is also needed is a solution to this temperature sensitivity.

Heretofore, the requirements of obviating moisture and temperature sensitivity referred to above have not been fully met. What is needed is a solution that simultaneously addresses all of these requirements.

SUMMARY OF THE INVENTION

A primary goal of the invention is to improve the critical dimension (CD) tolerance of high performance DUV photoresist by controlling the environment in which the photoresist is thermally processed, before and/or after the exposure step. Another primary goal of the invention is to improve the mechanical and physical properties of materials (e.g. low dielectric constant, low-k liquid polymers) used in increasing the signal transmission speed of metal interconnects.

A first aspect of the invention is implemented in an embodiment that is based on a method for improving performance of a polymer, comprising: forming said polymer on a surface of a wafer; then locating said wafer in an environment so that said environment is adjacent to said polymer; and then controlling an exchange between said polymer and said environment. A second aspect of the invention is implemented in an embodiment that is based on an apparatus for controlling an exchange between an environment and a polymer on a surface of a wafer located in said environment, said apparatus comprising: a chamber adapted to hold said wafer, define said environment, and maintain said polymer in an adjacent relationship with said environment; and a heater coupled to said chamber. A third aspect of the invention is implemented in an embodiment that is based on a method for improving performance of a spin-on material, comprising: forming said spin-on polymer on a surface of a wafer; then locating said spin-on material in an environment so that said environment is adjacent to said spin-on material; and then controlling an exchange between said spin-on material and said environment.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters (if they occur in more than one view) designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well-known components and processing techniques are omitted so as not to unnecessarily obscure the invention in detail.

The context of the invention includes fabrication of microelectronic structures with photoresist and coating microelectronic structures with spin-on materials. The invention can also utilize data processing methods that transform process monitoring signals so as to actuate interconnected discrete hardware elements; for example, to change the partial pressure of an environmental species or change the environmental and/or wafer temperature.

The concept of the invention provides a structure or assembly for providing a control environment to affect the exchange of chemical species between a liquid polymer on a semiconductor wafer. In particular, the invention may include a wafer processing chamber as part of a lithography track tool for fabricating wafers. A wafer processing chamber can be an environmentally controlled structure into which solvent, moisture and other chemicals (such as nitrogen, water, helium, argon, hydrogen, air or ammonia) can be introduced, monitored and controlled; and out of which solvent, moisture and other chemicals can be extracted. The wafer processing chamber allows for controlling environmental factors such as temperature, pressure, and/or species partial pressure humidity (e.g., to affect development of a film on a surface of the wafer, such as polymer films for photoresist processes, and low dielectric constant liquid polymers). A heater may be coupled to the chamber to control the temperature of the environment. The wafer processing chamber may be coupled to inlet manifolds for providing gaseous and/or liquid mixtures that form a suitable environment within the chamber to control the development of films on the wafers. The structure or assembly of this invention may also be coupled to wafer manufacturing tools such as steppers. The term coupled, as used herein, is defined as connected, although not necessarily directly, and not necessarily mechanically.

The invention includes coating the wafer with low K dielectric liquid polymer and then treating the wafer in the enclosed wafer processing chamber with the appropriate amount of chemical and the appropriate length of time to obtain the desired properties. The pressure inside this chamber is also adjusted too.

Figure 1:
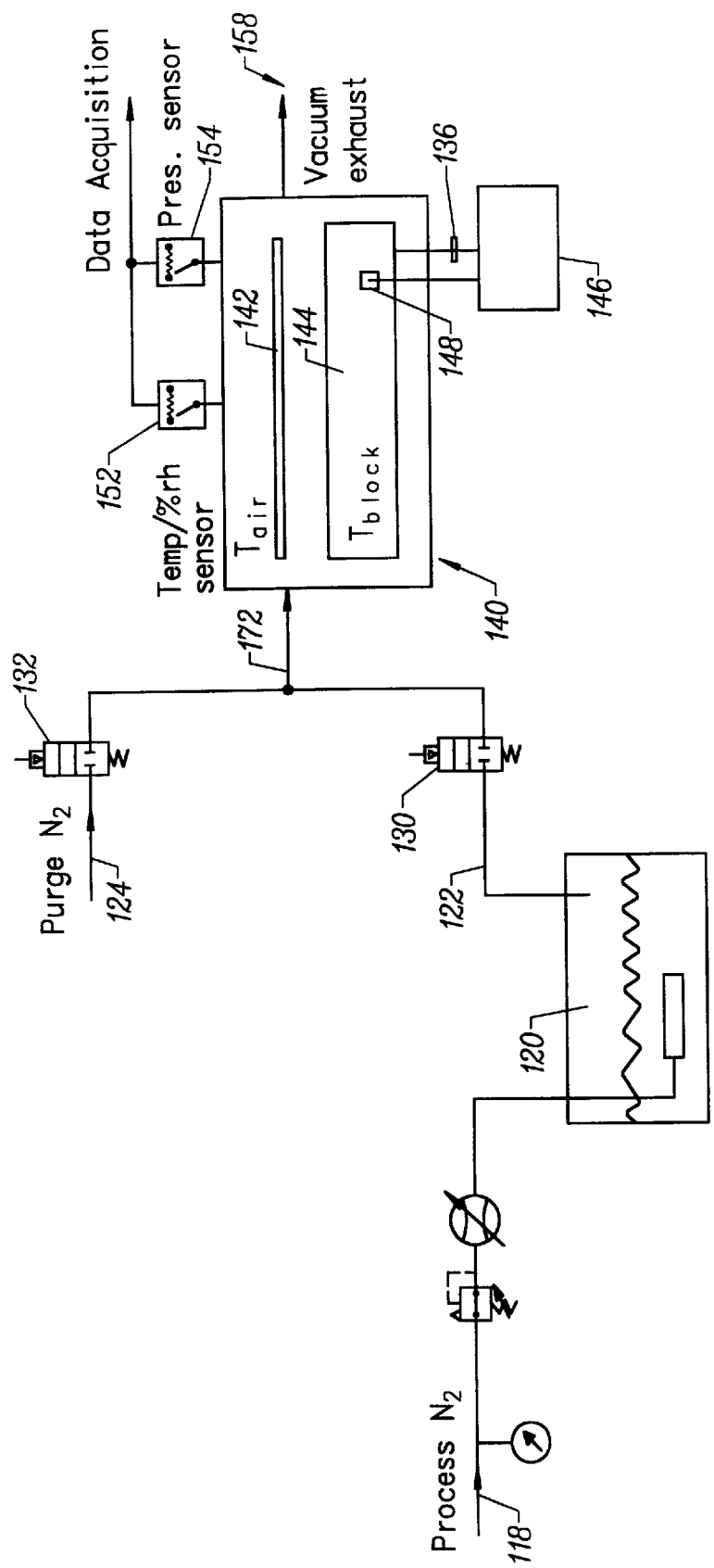
FIG. 1 illustrates a schematic diagram of an environmental exchange control system incorporating a water-filled canister with a bubbler, representing an embodiment of the invention.

FIG. 1 shows system incorporating an embodiment of the invention for developing a film layer over a wafer. The chamber 140 may be a wafer processing chamber such as a post application bake (PAB) module or post exposure bake (PEB) module. Preferably the chamber is used to provide, for example, DUV resist coats, ACETAL DUV treatment, a low dielectric liquid polymer, or an ultra low dielectric spin-on on material. The chamber 140 may be coupled to, for example, a stepper as part of a lithography track tool. The chamber 140 is adapted to hold or retain a wafer on a block 144, and is suitable for defining an environment conducive to developing films on wafers as illustrated with discussed embodiments. More specifically, the wafer within the chamber 140 may include a polymer layer, which may then be located within the chamber 140 so that the polymer film is exposed to an environment. The chemical and physical characteristics of the polymer may then be influenced by controlling the exchange between the polymer and the environment, which may be accomplished by affecting the environment and/or the polymer individually through external resources such as heaters/mass flow controllers/bubblers, etc.

An inlet manifold can be coupled to the chamber 140. The inlet manifold may provide an influx of environmental elements and affect conditions such as humidity and temperature through the influx of air and/or liquid. The chamber 140 may also be coupled to a heater 148 to heat the wafer and/or gas within the chamber 140.

In one embodiment, the inlet manifold may include or be coupled to an assembly for delivering air and/or liquid mixtures to a top surface of the wafer in a controlled manner so as to affect environmental properties such as temperature, humidity, pressure, and chemical composition. As shown by FIG. 1, the inlet manifold may include an intake conduit 172 coupled to the chamber 140 for providing controlled gas and/or liquid mixtures. The intake conduit 172 may be coupled to two or more conduits containing gasses and/or liquids, with the contents of the conduits feeding into the intake conduit 172. A first conduit 122 that feeds into the intake conduit 172 may be derived from a first gas source 118 extended into a bubbler 120, where the outlet mixture from the bubbler 120 is carried by the first conduit 122 to the intake conduit 172 via a valve 130. The first gas source 118 can provide clean, dry process gasses such as $N_2$. The bubbler 120 may be a water-filled canister that provides an outgoing mixture via the conduit 122 to affect environmental properties such as humidity or chemical composition. A second conduit 124 that feeds into the intake conduit 172 may be provided by another gaseous source, such as a source of purge $N_2$. The gas/liquid contained within the second conduit 124 may be provided with a preselected temperature, humidity, or other quantity. Preferably, the first valve 130 and a second valve 132 control the feed of the first conduit and the second conduit into the intake conduit 172. The intake conduit 172 may then couple with a shower 142 within the chamber 140 to dispense a fluid and/or gas mixture.

Preferably, the chamber 140 may include a block 144 and the shower 142. The wafer may sit on the block 144 within the chamber 140 so as to be adjacent the environment and receive the fluid/gas dispensed by the shower 142. The block 144 may incorporate or otherwise be coupled to the heater 148 that heats both the block 144 and the wafer to a controlled temperature. A heating power controller 146 and block temperature sensor 136 may in combination control the temperature of the block 144, provided as $T_{block}$. The temperature of the gas or air within the chamber 140, shown as $T_{air}$, may be controlled by a second heater (not shown), and/or the temperature of the dispensed fluid/gas from the shower 142. A temperature sensor 152 may couple to the chamber to provide a temperature feedback that represents the temperature of the gas. A pressure control 154 may also be used to monitor and control the pressure of the environment within the chamber 140. The temperature sensor 152 and/or the pressure sensor 154 may be coupled to a data acquisition device (not shown).

Additional features that facilitate practice of this invention may also include a lid designed or adapted to permit loading or unloading of a wafer from within the chamber 140. Alternatively, the chamber 140 may include a gate designed to permit loading or unloading wafers from within the chamber 140. An outlet manifold 158 may exhaust gasses and/or liquids from the chamber 140. Preferably, the outlet manifold 158 is a vacuum exhaust. In certain applications such as forming DUV resist coat, outgasses exiting via the outlet manifold may be analyzed.

The wafer may include a polymer film for use in a lithography step of wafer manufacturing, including photoresist films, polymers, or low dielectric materials that are thermo-cured films. The films within the chamber may also be formed from spin casting polymers, and or from depositing a polymer on a metal interconnect. Other suitable films may include organic planarization films, anti-reflection films, siloxane spin-on-glass films, polymide films, and polymide siloxane films.

Figure 2:
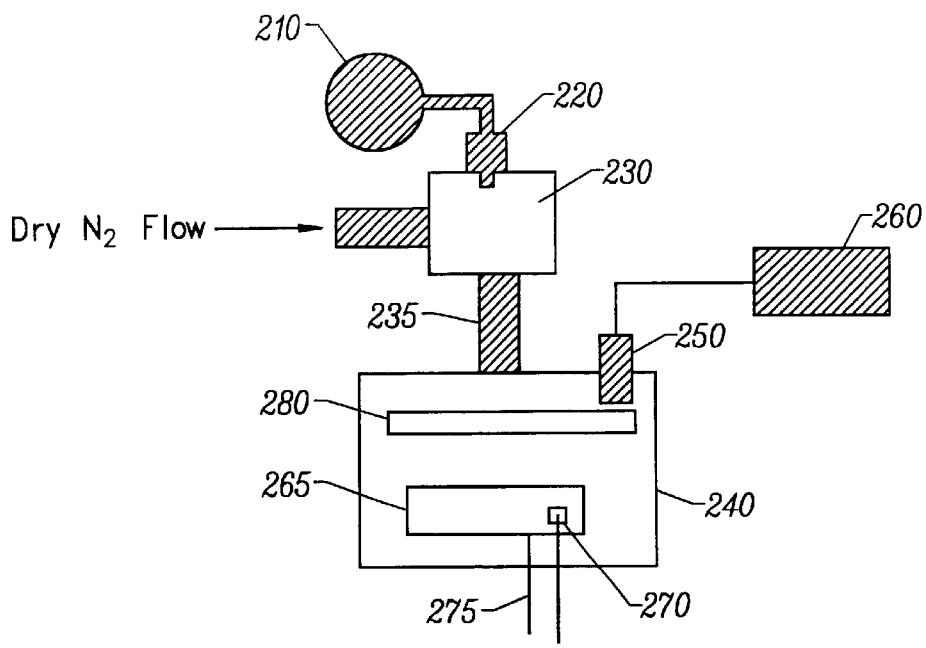
FIG. 2 illustrates a schematic diagram of an environmental exchange control system incorporating a mixing chamber with an atomizer, representing an embodiment of the invention.

FIG. 2 illustrates another embodiment of the present invention. In the system of FIG. 2, the inlet manifold may include or otherwise be associated with an atomizer 230. A pump 210 feeds a liquid mixture such as water into the atomizer 230. The atomizer 230 in combination with or dry $N_2$ flow provides micron-size liquid droplets into an inlet conduit 235. In combination, the pump 210 and the atomizer 230 provide a controlled vapor mixture into the chamber 240. Preferably, the pump 210 is an IVEK type pump, while the atomizer 230 is a sonic air nozzle atomizer. The inlet conduit 235 feeds a mixture of micron-size droplets into a chamber 240. As with the embodiment of FIG. 1, the chamber 240 is adapted to hold and expose a polymer on a surface of a wafer to environmental conditions that influence the chemical and mechanical properties of the polymer. By locating the polymers adjacent to a particular environment provided by the chamber 240, the exchange between the environment and the polymer may be controlled to develop the deprotection reaction of the polymer.

To this end, the chamber 240 may also be suitable for use with DUV resist coats before wafer exposure, ACETAL DUV treatment, ACETAL resist coats after wafer exposure, or low dielectric liquid polymers. As such, the chamber 240 may also include a temperature controlled block 265 coupled to a heater 270 and temperature sensor 275, as well as a shower head 280 or other dispensers such as nozzles for dispensing the micron-sized droplets over the wafer. A temperature sensor 250 controls the temperature of the environmental gas or air within the chamber 240. An outlet conduit 255 from the chamber 250 feeds the gas and/or liquid mixture to a data acquisition device 260.

Figure 3:
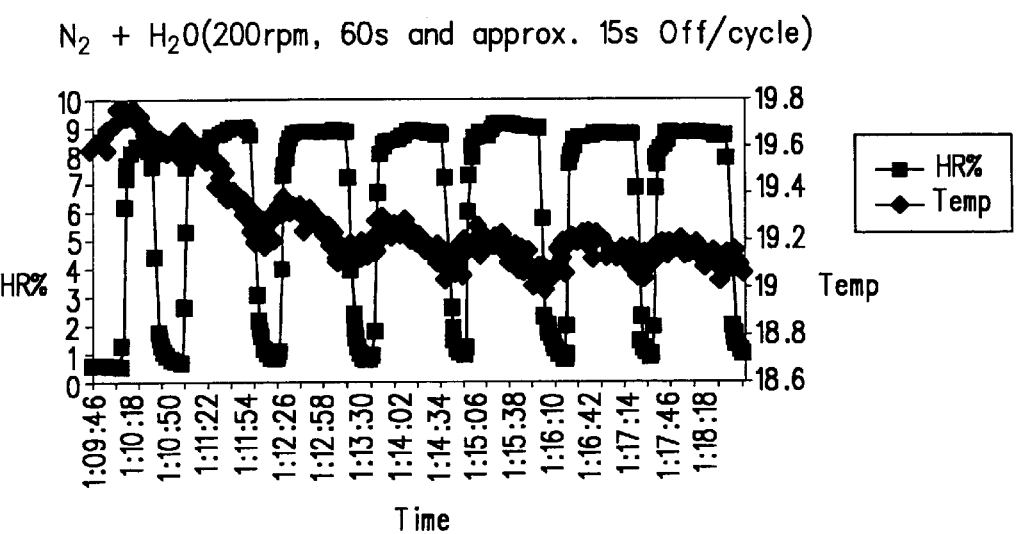
FIG. 3 illustrates percent relative humidity and temperature in an environmental exchange control chamber as a function of temperature, representing an embodiment of the invention.

Referring to FIG. 3, environmental temperatures and relative humidity are depicted for a cyclic test of a system representing an embodiment of the invention. It can be appreciated that the relative humidity in the environment can be precisely cycled within a range of from approximately 0% relative humidity to approximately 10% relative humidity. It can also be appreciated that the temperature response lags behind the introduction of additional system heat capacity via the additional moisture.

FIG. 3 shows that flow HR % and temperature become repeatable after the flow reaches a steady state. The slight difference between each cycle could be caused by the difference of the dispensing OFF time and the fluctuation of $N_2$ flow.

This invention may be implemented or incorporated with several wafer processing sub-steps to control and increase sensitivity of films residing on wafers during fabrication. A discussion of several embodiments of the invention that involve the use of ACETAL resists, low dielectric liquid polymers, and ultra low dielectric spin on materials follows:

First Embodiment

After forming a DUV resist coat on a wafer, the wafer and the coating may be dehydrated within a wafer processing chamber that is being utilized as a post application bake (PAB)module. This involves controlling an exchange between the polymer coating and a surrounding environment defined by the wafer-processing chamber. Specifically, drawing moisture out of the environment will cause the amount of available water on the surface of the polymer to be reduced as this water exchanges to the environment in an attempt to achieve equilibrium. A gaseous mixture such as $N_2$ may be introduced into the wafer processing chamber so that the wafer processing chamber dehydrates the DUV resist coat. The wafer may then be exposed in a normal manner by a stepper and/or scanner tool. Since the resist coat material has been dehydrated before entering the exposure part of the process, only a minute amount of deprotection will take place, during the exposure. As such, the outgas during exposure is minimal, and significantly reduced in comparison to embodiments that lack this PAB dehydration feature. Elimination of outgassing ultimately prevents or reduces the risk of contamination that may damage equipment such as a lens of the stepper exposure tool.

After the DUV resist coat is exposed, the material on the wafer may be hydrated in an enclosed wafer processing chamber during a post exposure bake (PEB) step. This hydrating process involves controlling an exchange between the exposed polymer and an environment defined by the post exposure bake wafer processing chamber. Specifically, introducing moisture into the environment will cause the amount of water available on the surface of the exposed polymer to increase as the moisture in the environment exchanges to the surface of the polymer in an attempt to achieve equilibrium. The wafer may then be transported to yet another enclosed wafer processing chamber for another PEB process. A controlled amount of moisture is introduced into the post exposure enclosed wafer processing chamber while the wafer is being baked to initiate deprotection. Pattern formation will then take place. Since the wafers are dehydrated prior to this point, substantially no deprotection has previously taken place. This allows deprotection to be focused in one step, thereby increasing the contrast (photo speed) of the photoresist.

Second Embodiment

In second embodiment, an ACETAL DUV coated wafer is treated in an environmentally controlled chamber forming a bake unit during a post application sub-step. The chamber regulates a known amount of solvent, moisture or chemical (s) for the purpose of treating the wafer in a controlled fashion. In this embodiment the controlled exchange with the surface of the polymer is limited to the time during which the wafer is located in the environment defined by the PAB unit. Under these conditions, the final performance of the ACETAL resist may be enhanced. In comparison with the prior without any change of resist chemistry or exposure tool.

Third Embodiment

In a third embodiment the wafer is treated once after the wafer is exposed. More specifically, after the DUV coated wafer is photolithographically exposed in the stepper, the wafer is transferred to an environmentally controlled chamber forming a PEB unit. In the chamber, a known amount of solvent, moisture or chemical is regulated to treat the wafer in a controlled fashion. In this embodiment, the controlled exchange between the environment and the polymer is limited to the time in which the wafer is located in the PEB unit. Under these conditions, the final performance of the ACETAL resist may be enhanced in comparison to the prior art without any change of resist chemistry or exposure tool.

Fourth Embodiment

In a fourth embodiment, a low dielectric liquid polymer. A low dielectric liquid polymer is normally spin coated onto the wafer using a track similar to the one that is used for depositing photoresist. A series of thermal processes are used sequentially to cure the low dielectric film and obtain the desired final properties for the film. Low dielectric liquid polymers provide one way of reducing the capacitance between metal interconnect layers of ULSI circuits. The phrase "low dielectric constant material" is defined herein as having a dielectric constant ranging from approximately 2.5 to approximately 3.5, with air being approximately equal to one. This parameter is a unitless measure.

Smaller capacitance allows higher operating speed for these devices with reduced power consumption. A wafer processing chamber may affect the development of a low dielectric liquid polymer by controlling the environmental conditions surrounding the wafer within the wafer processing chamber. More specifically, the wafer processing chamber of this invention controls the introduction of moisture, solvent and other chemical to form an environment conducive to the formation of desired film properties, such as uniform film thickness. In addition, controlling the environment within the wafer processing chamber reduces volumetric contraction and/or void formation of the film after its application onto the device wafer.

Fifth Embodiment

In a fifth embodiment, a spin-on material is coated on a wafer. This spin-on material may function as an ultra low dielectric constant layer, optionally adjacent one or more interconnect layers. The phrase "ultra low dielectric constant material" is defined herein as having a dielectric constant ranging from approximately 1.5 to approximately 2.5, with air being approximately equal to 1. As noted above this parameter is a unitless measure. Some of these materials are known as xerogel materials. An example of a xerogel material is nano porous silica ($SiO_2$, bulk K approximately= 4). The bulk dielectric constant of composite xerogel materials can be from approximately 1to approximately 2, again with air set to be approximately equal to 1.

While not being limited to any particular performance indicator or diagnostic identifier, preferred embodiments of the invention can be identified one at a time by testing for the presence of minimal deprotection. The test for the presence of minimal deprotection can be carried out without undue experimentation by the use of a simple and conventional tribology experiment.

Practical Applications of the Invention

A practical application of the invention that has value within the technological arts is the use of photoresists. Further, the invention is useful in conjunction with low dielectric films (such as are used for the purpose of reducing capacitance), or in conjunction with deposition processes (such as are used for the purpose of depositing structural layers), or the like. There are virtually innumerable uses for the invention, all of which need not be detailed here.

Advantages of the Invention

A method or apparatus, representing an embodiment of the invention, can be cost effective and advantageous for at least the following reasons. This invention improves the lithographic performance and process control of the ACETAL-based or any environmentally sensitive DUV photoresists and improves their chances of being successfully used for smaller feature sizes. This invention provides a way to eliminate/minimize outgassing of the ACETAL-based or any environmentally sensitive photoresists during the exposure step, thereby preventing contamination of the projection optics of exposure tools. This invention improves the mechanical and physical properties of low dielectric constant liquid polymeric films. This invention helps to prevent contamination of stepper optics.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the enclosed thermal chamber described herein can be a physically separate module, it will be manifest that the enclosed thermal chamber may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive. It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method for improving photosensitivity of a material, comprising:

forming a layer of photosensitive material on a surface;

locating the surface in a first fluid environment within a processing chamber, wherein a first fluid is in contact with the photosensitive material;

controlling an exchange of mass between the photosensitive material and the first fluid environment, wherein the exchange of mass is controlled by: measuring at least two independent thermodynamic variables of the first fluid; and introducing and extracting chemical species to the first fluid environment responsive to the measurements;

exposing the photosensitive material;

establishing a second fluid environment, wherein a second fluid is in contact with the photosensitive material; and controlling an exchange of mass between the photosensitive material and the second fluid environment, wherein the exchange of mass is controlled by: measuring at least three independent thermodynamic variables of the second fluid; and introducing and extracting chemical species to the second fluid environment responsive to the measurements.

2. The method of claim 1, wherein the photosensitive material is in a liquid state.

3. The method of claim 1, wherein the photosensitive material is a thermo-cured, polymer.

4. The method of claim 1, wherein forming includes spin casting the photosensitive material on the surface.

5. The method of claim 3, wherein forming the photosensitive material on said surface includes forming the photosensitive material on a metal interconnect.

6. The method of claim 1, wherein controlling an exchange of mass between the photosensitive material and the first fluid environment takes place, at least in part, in a post application bake chamber.

7. The method of claim 1, wherein controlling an exchange of mass between the photosensitive material and the first fluid environment takes place, at least in part, in a stepper.

8. The method of claim 1, wherein controlling an exchange of mass between the photosensitive material and the second fluid environment takes place, at least in part, in a post exposure bake chamber.

9. The method of claim 1, wherein controlling an exchange of mass includes controlling a partial pressure of a gaseous species.

10. The method of claim 9, wherein the gaseous species is at least one species selected from a group consisting of helium and argon.

11. The method of claim 9, wherein the gaseous species includes at least one species selected from a group consisting of $H_2O$, $H_2$, $N_2$, air and $NH_3$.

12. The method of claim 1, wherein controlling an exchange of mass between the photosensitive material and the second fluid environment takes place, at least in part, in a stepper.

* * * * *